(12) United States Patent
Despesse et al.

(10) Patent No.: US 8,773,004 B2
(45) Date of Patent: Jul. 8, 2014

(54) CIRCUIT FOR OPTIMIZING THE RECOVERY OF VIBRATORY ENERGY BY A MECHANICAL/ELECTRICAL CONVERTER

(75) Inventors: Ghislain Despesse, Voreppe (FR); Bouhadjar Ahmed Seddik, Bourg-les-Valence (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/981,348

(22) PCT Filed: Jan. 19, 2012

(86) PCT No.: PCT/EP2012/050804
§ 371 (c)(1),
(2), (4) Date: Oct. 8, 2013

(87) PCT Pub. No.: WO2012/101037
PCT Pub. Date: Aug. 2, 2012

(65) Prior Publication Data
US 2014/0021828 A1    Jan. 23, 2014

(30) Foreign Application Priority Data
Jan. 24, 2011  (FR) ...................................... 11 50531

(51) Int. Cl.
*H01L 41/107* (2006.01)
*H02N 2/18* (2006.01)
(52) U.S. Cl.
CPC ..................................... *H02N 2/181* (2013.01)
USPC .......................................................... 310/339

(58) Field of Classification Search
CPC .... H01L 41/113; H01L 41/1136; H02N 2/18; H02N 2/181
USPC .......................................... 310/339, 330, 318
See application file for complete search history.

(56) References Cited

U.S. PATENT DOCUMENTS 7,965,016 B2 *  6/2011  Despesse et al. ............. 310/319
(Continued)

FOREIGN PATENT DOCUMENTS

FR        2 896 635 A1     7/2007
WO     2011/072770 A1     6/2011

OTHER PUBLICATIONS

Wen-Pin Shih et al., "Tunable Capacitor Based on Polymer-Dispersed Liquid Crystal for Power Harvesting Microsystems", *IEEE Transactions of Electron Devices*, 55(10): pp. 2568-2573 (2008).

(Continued)

*Primary Examiner* — J. San Martin
(74) *Attorney, Agent, or Firm* — Occhiuti & Rohlicek LLP

(57) ABSTRACT

An apparatus for converting mechanical vibration energy into electrical energy includes a converter that, when subjected to vibrations, generates an electrical potential difference, and an electrical circuit connected to terminals of the converter. The circuit includes a first arm and a second arm parallel to the first warm. The first arm has a first variable-capacitance capacitor system. The second arm includes an electrical load to be powered. A second variable-capacitance capacitor is series-connected with the electrical load. A control circuit is configured to modify respective capacitance values of the first and second capacitor systems so as to modify the converter's mechanical resonance frequency.

16 Claims, 7 Drawing Sheets

(56) References Cited

U.S. PATENT DOCUMENTS

| | | | |
|---|---|---|---|
| 7,977,923 B2* | 7/2011 | Pelrine et al. | 320/166 |
| 8,102,098 B2* | 1/2012 | Nishigaki et al. | 310/332 |
| 8,299,681 B2* | 10/2012 | Snyder et al. | 310/318 |
| 8,368,290 B2* | 2/2013 | Kwon et al. | 310/339 |
| 8,471,439 B2* | 6/2013 | Moon et al. | 310/339 |
| 2003/0067245 A1 | 4/2003 | Pelrine et al. | |
| 2003/0209953 A1 | 11/2003 | Park | |
| 2005/0088059 A1* | 4/2005 | Ohkubo et al. | 310/319 |
| 2010/0102673 A1 | 4/2010 | Leukkunen | |

OTHER PUBLICATIONS

Davis et al., "An actively tuned solid-state vibration absorber using capacitive shunting of piezoelectric stiffness" *Journal of Sound & Vibration*, 232(3): pp. 601-617 (2000).

Dibin et al., "Topical Review: Strategies for increasing the operating frequency range of vibration energy harvesters: a review" *Measurement Science and Technology*, 21(2): 22001 (2010).

Ben-Yaakov et al., "New resonant rectifier for capacitive sources" *23rd IEEE Convention of Electrical and Electronics Engineers in Israel*, pp. 48-51 (Sep. 6-7, 2004).

* cited by examiner

CIRCUIT FOR OPTIMIZING THE RECOVERY OF VIBRATORY ENERGY BY A MECHANICAL/ELECTRICAL CONVERTER

CROSS REFERENCE TO RELATED APPLICATION

This application is the national phase under 35 USC 371 of international application no. PCT/EP2012/050804, filed Jan. 19, 2012, which claims the benefit of the priority date of French application no. 1150531, filed Jan. 24, 2011. The contents of the aforementioned applications are incorporated herein in their entirety.

FIELD OF DISCLOSURE

The invention pertains to devices for converting mechanical energy into electrical energy and especially to independent power supply devices generating electrical energy from a vibrational motion.

BACKGROUND

In certain environments, it may be difficult to connect an electrical circuit to power supply cables, for example in hostile environments or in mechanisms in motion. To overcome this problem, micromechanical devices for converting vibration energy into electrical energy are known. These devices form microsystems generally attach to vibrating supports such as machines or vehicles. One known technique uses a resonant system to amplify a mechanical vibration of a support and convert the amplified motion into electricity. The electrical circuit can thus be powered without using cables coming from the exterior.

One of the known principles for converting mechanical vibration energy into electrical energy is based on the vibrational excitation of a beam provided with piezoelectric elements. Such a beam generally has a core with a first end embedded in a vibrating support. A mobile mass is fixed to the second end of the core. A piezoelectric element is fixed to the upper face of the core and another piezoelectric element is fixed to the lower face of the core. An electrical circuit is connected to the terminals of the piezoelectric elements which are placed electrically in series or in parallel. The piezoelectric elements are intended for converting the mechanical energy transmitted by the mobile mass into electrical energy.

Another known principle used to convert mechanical vibration energy into electrical energy is based on an electrostatic system. The electrostatic system uses a variable capacitance to convert the mechanical vibration energy into electrical energy.

The recurrent problems that arise with the different types of energy-harvesting microstructures are the small quantity of energy harvested, the low efficiency of energy harvesting when the frequency of the vibration moves away from the inherent mechanical resonance frequency of the system and the narrowness of the bandwidth of vibration energy harvesting.

With a piezoelectric structure, in order to increase the bandwidth of the frequencies of vibrations that generate electrical energy, the mechanical resonance frequency of the resonant system can be modified by controlling the polarization of a first piezoelectric element, as presented in the thesis by David Charnegie, "Frequency tuning concepts for piezoelelectric cantilever beams and plates for energy harvesting". The electrical energy is then harvested at a second piezoelectric element. The stiffness of the first piezoelectric element can thus be modified actively to modify the stiffness of the beam and thus influence the frequency of the mechanical resonance. To this end, a variable capacitance is connected in parallel with a first piezoelectric element. Since the second piezoelectric element is not connected to the variable capacitance, this variable capacitance does not affect the harvesting of electrical energy in the electrical load.

Thus, it is possible to set up an automatic control over the mechanical resonance frequency of the system. An automatic control of this kind proves to be necessary when a system from which vibration energy is extracted has a variable vibration frequency. An example of such a system is a motor vehicle in which the rotation speed of the engine or the rotation speed of the wheels undergoes great variations.

While such a system enables the mechanical resonance frequency to be adapted to the frequency of the vibration source, it does not yet sufficiently optimize energy harvesting. In particular, this system especially does not make it possible to ensure that the electrical damping of the electrical load is equal to the mechanical damping of the beam. In addition, it is difficult to envisage the modification of the impedance of the load in order to modify the mechanical resonance frequency without disturbing the operation of this load. Nor does this system make it possible to optimize the energy harvested from the piezoelectric elements.

The document "Tunable Capacitor Based on Polymer-Dispersed Liquid Crystal for Power Harvesting Microsystems" published on Jan. 10, 2008, describes an adjustable capacitor based on PDLC liquid crystal. The document describes the integration of such a capacitor in a device for harvesting vibration energy. The efficiency of the energy harvesting device is improved by adjusting the resonance frequency of a piezoelectric beam to the ambient vibration frequency, using the adjustable capacitor.

SUMMARY

The invention seeks to resolve one or more of these drawbacks. The invention relates especially to a device for converting mechanical vibration energy into electrical energy, comprising:
- a converter generating a difference in potential when it is subjected to vibrations;
- an electrical circuit connected to the terminals of the converter and comprising first and second arms in parallel, the first arm comprising a first variable-capacitance capacitor system, the second arm comprising a second variable-capacitance capacitor system series-connected with an electrical load to be powered;
- a control circuit configured to modify the respective capacitance values of the first and second capacitor systems so as to modify the mechanical resonance frequency of the converter.

According to one variant, the converter includes at least one piezoelectric system deformed during the application of vibrations.

According to yet another variant, the piezoelectric system is attached to a beam having a first end embedded in a vibrating support and a second end embedded in a mobile mass.

According to another variant, the piezoelectric system is polarized in the direction of the length of the beam.

According to yet another variant, the device furthermore comprises:
- an accelerometer configured to measure the instantaneous acceleration of the vibrating support;

a device for measuring the instantaneous voltage at the terminals of the piezoelectric system;

the control circuit being configured to modify the respective capacitance values of the first and second capacitor systems so as to maintain the voltage at the terminals of the piezoelectric system in phase-quadrature with the acceleration of the vibrating support.

According to yet another variant, the device furthermore comprises a first comparator circuit generating a square signal from the instantaneous acceleration measured and a second comparator circuit generating a square signal from the voltage measured, a phase-shift circuit applying a 90° phase shift to one of the generated square signals, the control circuit modifying the respective capacitance values of the first and second capacitor systems as a function of the relative phase between the phase-shifted signal generated from one square signal and the other square signal.

According to yet another variant, the device furthermore comprises a first comparator circuit generating a square signal from the measured instantaneous acceleration and a second comparator circuit generating a square signal from the measured voltage, a circuit determining the overlap duty cycle between the generated square signals, the control circuit modifying the respective capacitance values of the first and second capacitor systems as a function of the determined overlap duty cycle.

According to another variant, the device furthermore comprises an analog multiplier multiplying the measured acceleration by the measured voltage, the control circuit modifying the respective capacitance values of the first and second capacitor systems as a function of the DC component of the output signal of the analog multiplier.

According to yet another variant, the first and second capacitor systems are sized so that the control circuit can make the equivalent capacitance Ce of the first and second arms in parallel vary between a value below 0.2*Cp and a value above 1.5*Cp, Cp being the capacitance of the piezoelectric system.

According to yet another variant, the device furthermore comprises a DC voltage source, with adjustable amplitude, series-connected with the converter, the control circuit being configured to modify the amplitude of the DC voltage source.

According to one variant, the first and second capacitor systems comprise a set of capacitors, each of the capacitors of this set being series-connected with a respective switch controlled by the control circuit.

According to another variant:

the first arm comprises a set of n capacitors C1$i$ connected in parallel, i being an integer ranging from 1 to n, each capacitor C1$i$ being series-connected with a respective switch k1$i$, the capacitance values of the capacitors C1$i$ being defined by the relationship:

$C1i=2^{i-1}*C\alpha$, with $C\alpha$ being a reference capacitance value;

the second arm comprising a set of n capacitors C2$i$ connected in parallel, i being an integer between 1 and n, each capacitor C2$i$ being series-connected with the respective switch k2$i$, the capacitance values of the capacitors C2$i$ being defined by the relationship:

$C2i=2^{i-1}*C\beta$, with $C\beta$ being a reference capacitance value.

According to yet another variant, the device comprises a digital counter, each output bit of which controls a respective switch.

According to yet another variant, the control circuit comprises a regulation circuit configured to modify the capacitance values of the first and second systems of capacitors so as to optimize the power in the load of the electrical circuit.

According to one variant, the maximum difference in potential generated by the converter is at least five times greater than the difference in potential for powering the circuit to be powered.

BRIEF DESCRIPTION OF THE FIGURES

Other features and advantages of the invention shall appear clearly from the description made here below, by way of an indication that is in no way exhaustive, with reference to the appended drawings, of which.

DETAILED DESCRIPTION

Figure 1:
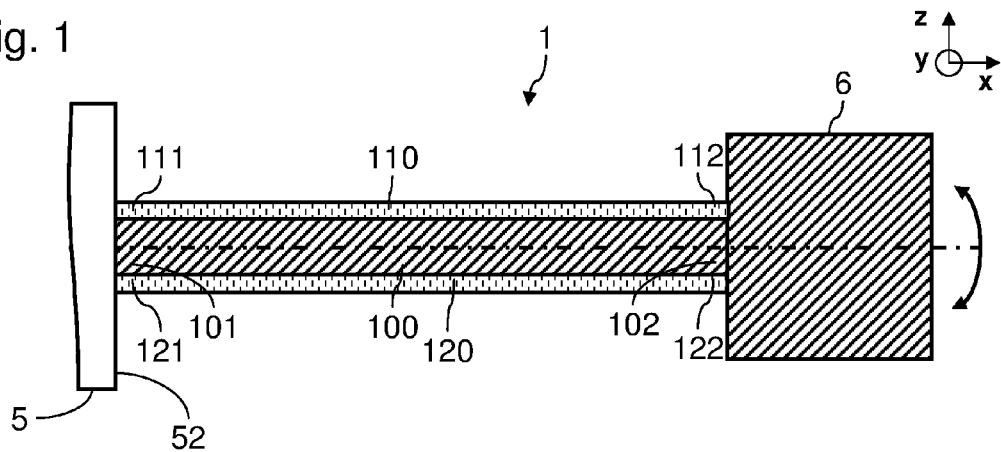
FIG. 1 is a schematic view in longitudinal section of an example of a mechanical structure of a device for converting mechanical vibration energy according to the invention.
Figure 2:
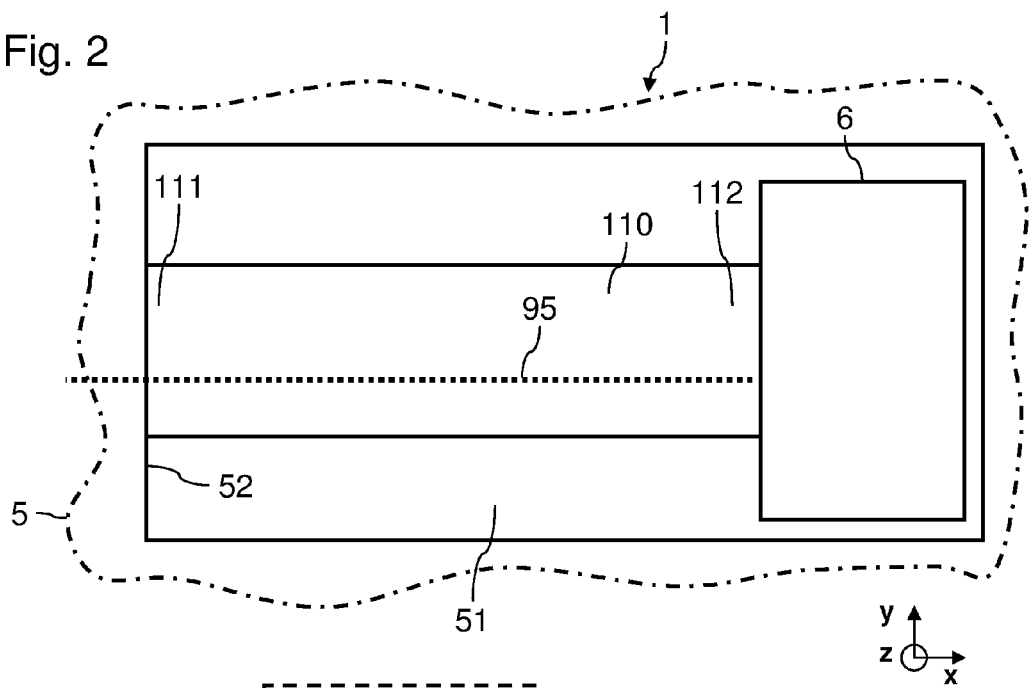
FIG. 2 is a top view of the device of FIG. 1.

FIG. 1 represents a schematic view in longitudinal section of an example of a mechanical structure of a device for converting mechanical vibration energy into electrical energy 1. FIG. 2 is a top view of the conversion device 1. The device 1 comprises the support 5 designed to be fixedly joined to the system for generating mechanical vibration energy. The device 1 also comprises a mobile mass 6, housed in a recess 51 made in the support 5. A beam 100 extends longitudinally (along the axis x in the referential system illustrated) between the support 5 and the mobile mass 6. The beam 100 can be a microstructure having a length of less than 10 mm. The beam 100 has two longitudinal ends 101 and 102. The ends 101 and 102 are embedded respectively in the support 5 and in the mobile mass 6. The mobile mass 6 is held suspended by means of the beam 100 in the recess 51 made in the support 5. The beam 100 is configured to bend around an axis having a direction y under the effect of the relative motion between the mobile mass 6 and the support 5 along the direction z.

Advantageously, the support 5, the mobile mass 6 and the beam 100 are formed as one piece in a silicon substrate (or steel substrate). Such a configuration can easily be obtained with prior-art techniques for shaping silicon or steel, making it possible to obtain appropriate moduli of elasticity for a conversion device according to the invention.

Advantageously, the mobile mass 6 has a mass appreciably greater than the mass of the beam 100. Thus, the mechanical resonance frequency can be defined more easily and the storable mechanical energy (kinetic and potential energy) can be greater for a same mass and a same shift at the end of the beam 100.

The beam 100 has a piezoelectric element 110 fixed to its upper face and a piezoelectric element 120 fixed to its lower face. The piezoelectric elements 110 and 120 extend longitudinally between the support 5 and the mobile mass 6. The piezoelectric elements 110 and 120 have an appreciably longitudinal polarization. Thus, an electrical voltage is generated between their ends, respectively 111 and 112, and 121 and 122, when they are subjected to a longitudinal tensile or compressive force induced by a bending of the beam 100.

The electrical capacitance associated in this embodiment is relatively low and proportional to the cross-section of the piezoelectric element divided by the length of the beam. It can thus prove to be advantageous for the piezoelectric elements to have a transverse polarization (on the axis z) in order to have a relatively great electrode surface area (lower and upper faces that extend throughout the length of the beam 100) with a relatively small inter-electrode distance (the thickness of the piezoelectric elements is much smaller than the length of the beam). Since the voltage generated is proportional to the inter-electrode distance, such a polarization also limits the risks of dielectric disruption.

The end 112 of the piezoelectric element 110 is connected to a circuit to be powered and to an adaptation circuit (not shown) by means of an electrical wiring 95. The end 111 is connected to the ground of the circuit to be powered and of the adaptation circuit by means of the support 5 formed in a semi-conductor substrate. Similarly, the end 122 of the piezoelectric element 120 is connected to the ground of the circuit to be powered. An electrical wiring (not shown) connects the end 121 to the circuit to be powered and to the adaptation circuit.

In the example, the longitudinal direction is defined as a direction perpendicular to the face 52 of the support 5 to which the beam 100 is fixed. The beam 100 herein has a relatively simple structure. It is also possible however to envisage structures that favor homogeneous stresses in the piezoelectric elements as described in the paper by Goldschmidtboeing and Muller, "Optimization of resonant harvesters in piezopolymercomposite technology", distributed at the PowerMEMS conference, 28 and 29 Nov. 2007.

Figure 3:
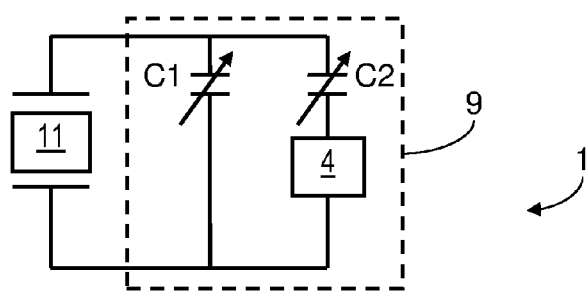
FIG. 3 is a drawing showing the principle of the electrical circuit formed by the conversion device according to the invention.

As illustrated in FIG. 3, the mechanical system 11 (comprising the mobile mass 6, the beam 100 and its piezoelectric elements 110 and 120) generate a potential difference between two electrical connection terminals. These electrical connection terminals are connected to an electrical circuit 9 comprising a load to be powered 4 and variable-capacitance capacitor systems C1 and C2.

The following parameters will be used hereinafter:
fv vibration frequency of the support 5;
frm mechanical resonance frequency of the assembly 11;
ξe electrical damping of the conversion device 1;
ξm mechanical damping of the assembly 11.

The variable-capacitance capacitor systems C1 and C2 define both the electrical damping of the circuit 9 and the mechanical resonance frequency frm of the mechanical system 11. The circuit 9 comprises first and second arms in parallel with the connection terminals of the mechanical system 11. The first arm includes the variable-capacitance capacitor system C1. The second arm includes the variable-capacitance capacitor system C2 in series with the electrical load 4 to be powered. For the sake of simplification, the load 4 is likened to a pure resistance.

Using a control circuit (not shown), the respective capacitance values of the capacitor systems C1 and C2 are modified in order to define an optimal mechanical resonance frequency frm of the system 11 and in order to obtain an electrical damping ξe in the conversion device 1 equivalent to the mechanical damping of the system 11. These two conditions maximize the electrical power at the level of the load, for a given amplitude of vibration and mobile mass. It is also possible to maintain the potential difference at the terminals of the load 4 at an optimal value of operation. The harvesting of electrical energy in the load 4 is then optimized. At the same time, a satisfactory setting of the mechanical resonance frequency frm is obtained. The mechanical resonance frequency frm targeted by the circuit 9 can be for example defined by a measurement of the vibration frequency fv by an appropriate measuring device (not shown).

The control of the respective capacitance values of the capacitors C1 and C2 makes it possible to adjust the proportion of current passing through the first arm and the proportion of current passing through the second arm (including the load 4 to be powered). The respective capacitance values of the capacitor systems C1 and C2 could be controlled by any appropriate means. The capacitance values could for example be defined in tables stored in the conversion device 1 according to the mechanical resonance frequency desired. The values of the capacitances of the capacitor systems C1 and C2 could also be defined by means of respective regulation loops.

In practice, the variation of capacitance of the circuit 9, defined by the variation of capacitance of the capacitor systems C1 and C2, modifies the temporal distribution of the electrical loads placed in the piezoelectric elements 110 and 120. The increase in the capacitance of the circuit 9 thus reduces the stiffness of the beam 100 and thus lowers the mechanical resonance frequency of the system 11. The distribution of the capacitance of the circuit 9 between the capacitor systems C1 and C2 makes it possible to adjust the electrical damping of the circuit 9. The increase in the capacitance of the capacitor system C2 relative to that of the capacitor system C1 increases the electrical damping of the circuit 9.

The electrical damping of the conversion device 1 is defined in practice by the following relationship:

$$\xi_e = k^2 \frac{\sqrt{1+(R*C_2*\omega)^2}}{2\sqrt{(C'_s+C'_p)^2+(R*C_2*C'_s*\omega)^2}}$$

With
ω the pulsing of the generated potential difference defined by the vibration frequency fv;
R the resistance of the electrical load 4;
k electromechanical coupling of the piezoelectric elements;
Cp the capacitance induced by the piezoelectric elements;
C'p=1+(C1/Cp)
C's=C2/Cp Advantageously, the potential difference that can be generated at the terminals of the system 11 is far greater than the potential difference of the load 4 to be powered. The piezoelectric elements 110 and 120 could for example generate a potential difference at least ten times greater than the potential difference applied to the load 4. The second arm then works as a voltage divider so as to be able to benefit from the potential difference appropriate for the load 4 while at the same time making it possible to vary the mechanical resonance frequency and the electrical damping. The voltage division ratio could then advantageously vary. A potential difference of this kind limits the incidence of the load 4 (which is essentially resistive) on the mechanical resonance frequency of the system 11. It is possible for example to provide for piezoelectric elements 110 and 120 enabling the generation of a potential difference of 50 V between their terminals, for an optimal voltage of the order of 3 V at the terminals of the load 4.

Figure 4:
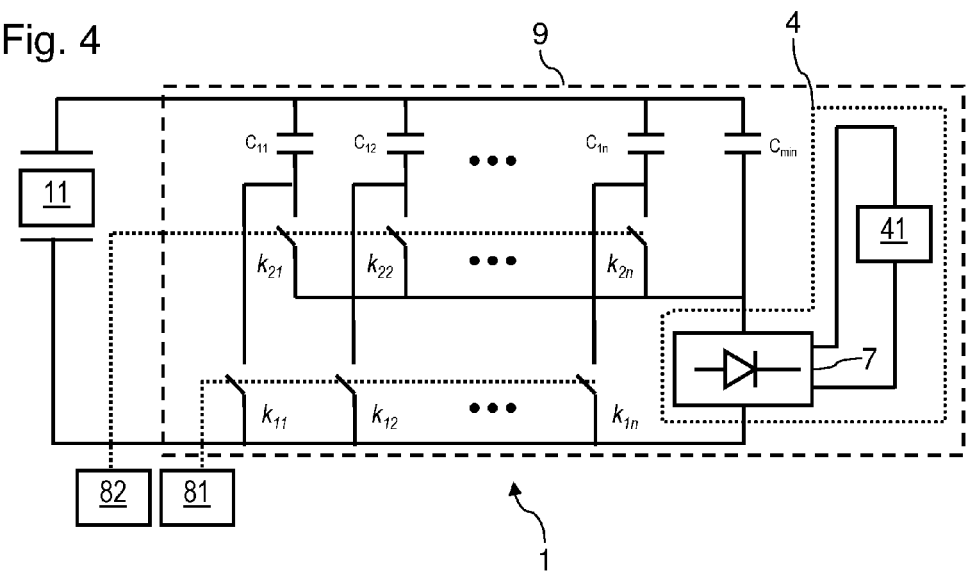
FIG. 4 is a schematic representation of a first embodiment of a circuit for adapting a conversion device.

FIG. 4 is a schematic view of a first embodiment of the circuit 9. The load to be powered 4 comprises firstly a consumer circuit 41 and an AC/DC converter 7. The converter 7 inputs an alternating potential difference generated by the alternating motion of the beam 100. The converter 7 can be implemented in the form of a diode bridge. The load 4 advantageously has an electrical storage device (for example a battery or a capacitor) connected to the output of the converter 7 to store energy when the circuit 41 is on standby. The circuit 9 furthermore comprises a set of capacitors C11 to C1n and Cmin having first electrodes connected to a first terminal of the system 11. The capacitors C11 to C1n and Cmin furthermore have second electrodes. The second electrodes of the capacitors C11 and C1n are connected, firstly, to a second terminal of the system 11 by means of switches k11 to k1n. The second electrodes of the capacitors C11 to C1n are connected, secondly, to an input of the converter 7 by means of switches k21 to k2n. The capacitors C11 to C1n can thus be used to form a first arm in parallel with the load 4, or to be connected in series with the load 4 in a second arm. The other input of the converter 7 is connected to the second terminal of the system 11. The opening or closing of the switches k11 to k1n is controlled by means of a control circuit 81. The opening or closing of the switches k21 to k2n is controlled by means of a control circuit 82. The selective closing of the switches k21 to k2n makes it possible to have an appropriate capacitance in series with the load 4. The selective closing of the switches k11 to k1n makes it possible to have an appropriate capacitance in series with the electrodes of the piezoelectric elements of the system 11.

To enable a highly precise adjustment of the capacitance values in series or in parallel with the electrical load, the capacitors C11 to C1n (or C1i with i ranging from 1 to n) could have capacitance values defined by the following relationship: $C1i=2^{i-1}*C$, where C is reference value of capacitance.

The presence of the capacitor Cmin advantageously makes it possible to place the circuit 9 beyond a saturation zone by having a minimum value of capacitance in series with the electrical load 4 as shall be described in detail with reference to the graph of FIG. 9. This capacitance furthermore makes it possible to deliver a minimum amount of energy to the load 4 even before the capacitors C1i and C2i can be controlled. Thus, at the load 4, it is possible to plan for a priority circuit to be powered with this first energy so that this priority circuit can then drive the capacitors C1i and C2i optimally.

Figure 5:
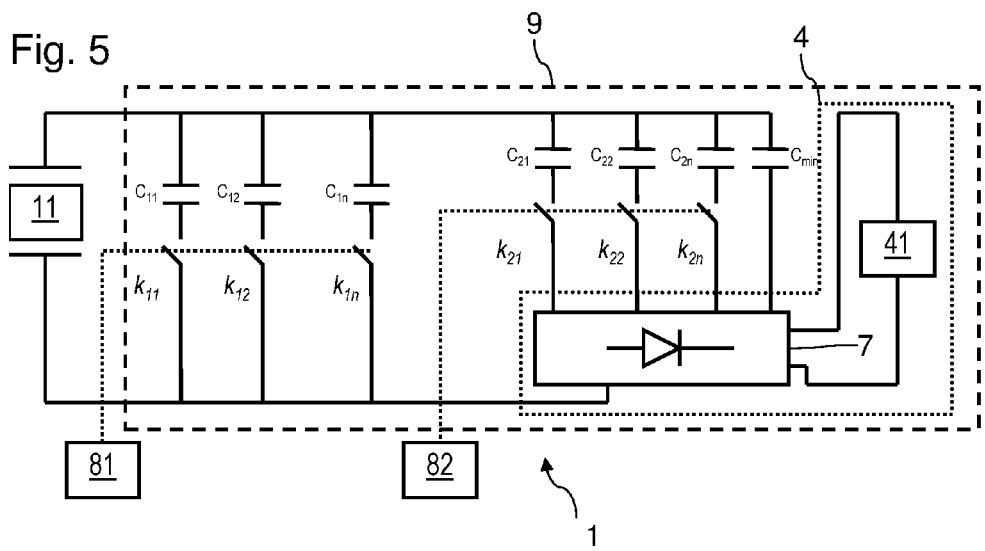
FIG. 5 is a schematic representation of a second embodiment of a circuit for adapting a conversion device.

FIG. 5 is a schematic view of a second embodiment of the circuit 9. The load to be powered 4 comprises firstly a consumer circuit 41 and an AC/DC converter 7. The converter 7 inputs an alternating potential difference generated by the alternating motion of the beam 100.

The circuit 9 furthermore comprises a set of capacitors C11 to C1n having first electrodes connected to a first terminal of the system 11. The capacitor C11 to C1n furthermore have second electrodes connected to a second terminal of the system 11 by means of switches k11 to k1n. The capacitors C11 to C1n can thus be connected to form an appropriate capacitance in a first arm, in parallel with the electrodes of the piezoelectric elements.

The circuit 9 furthermore has a set of capacitors C21 to C2n and Cmin having first electrodes connected to a first terminal of the system 11. The capacitors C21 to C2n furthermore have second electrodes connected to an input of the converter 7 by means of switches k21 to k2n. The capacitor Cmin is connected to this same input of the converter 7. The other input of the converter 7 is connected to second terminal of the system 11. The capacitors C21 to C2n and Cmin can thus be connected to form an appropriate capacitance, series-connected with the load 4 in a second arm.

The opening or closing of the switches k11 to k1n is controlled by means of a control circuit 81. The opening or closing of the switches k21 to k2n is controlled by means of a control circuit 82. The selective closure of the switches k21 and k2n makes it possible to have an appropriate capacitance in series with the load 4. The selective closing of the switches k11 to k1n makes it possible to have an appropriate capacitance in parallel with the piezoelectric elements. In this embodiment, the capacitors used in the two arms are dissociated.

To enable a highly precise adjustment of the capacitance values in series or in parallel with the electrical load by means of a numerical command, the capacitors C11 to C1n (or C1i, with i ranging from 1 to n) and C21 to C2n (or C2i, with i ranging from 1 to n) could have capacitance values defined by the following relationship: $C1i=2^{i-1}*C\alpha$, $C2i=2^{i-1}*C\beta$, with $C\alpha$ and $C\beta$ being reference values of capacitance respectively for the systems C1 and C2.

The presence of the capacitor Cmin advantageously makes it possible to place the circuit 9 above a saturation zone in having a minimum capacitance in series with the electrical load as shall be described in detail with reference to the graph of FIG. 9. This capacitance of the capacitor Cmin furthermore makes it possible to deliver a minimum amount of energy to the load even before the capacitors C1i and C2i can be controlled. Thus, it can be planned, at the load, that a priority circuit will be powered with this first energy so that it can then drive the switches k1i and k2i optimally.

Figure 6:
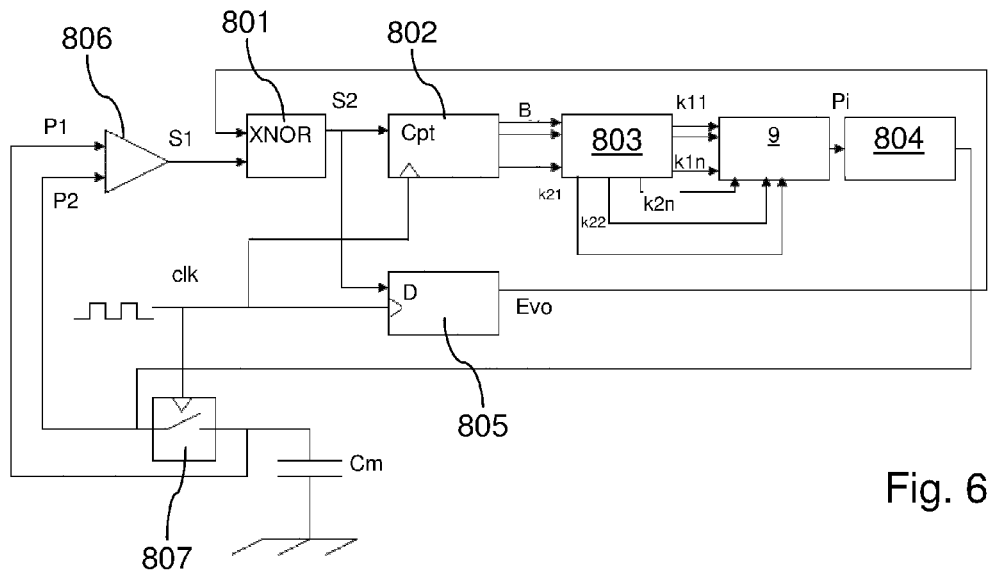
FIG. 6 is a schematic representation of a first variant of an automatic control circuit.

FIG. 6 illustrates a first embodiment of a circuit for tracking the mechanical resonance frequency. This circuit is based on a direct automatic control of the electrical power output by the system 11: the mechanical resonance frequency is adjusted automatically by permanently optimizing the electrical power delivered to the load 4. The instantaneous power Pi at the terminals of the load 4 of the circuit 9 is measured. The measured power is applied to a low-pass filter 804. The low-pass filter 804 outputs the equivalent of a sliding mean P2 of the measured power. The sliding mean P2 is applied to an input of a comparator 806. A value P1 of the sliding mean, pre-memorized during the preceding clock cycle in a storage capacitor Cm, is simultaneously applied to the other input of the comparator 806. The comparator 806 generates a signal S1. The signal S1 is equal to 1 if the power has increased and if not it is equal to 0. The signal S1 is applied to an input of an XNOR gate 801. A signal EVO is applied to the other input of the XNOR gate 801. This signal represents a sign of the preceding evolution of the mechanical resonance frequency. If the signal Evo is identical to the signal S1, then the gate 801 generates a signal S2 equal to 1. If not, the signal S2 generated is equal to 0. The signal S2 is applied to the input of a counter 802. The counter 802 counts up or counts down depending on whether S2 is equal to 0 or 1. The counter 802 in practice keeps the same counting sense if the previous counting has led to an increase in power or changes the counting sense if, on the contrary, the power has diminished. The output of the counter 802 applies a value B to the input (address bus) of a non-volatile memory 803 (for example an EEPROM memory). The value of B thus corresponds to an address of the non-volatile memory 803. The non-volatile memory 803 stores corresponding opening and closing configurations at this address. The non-volatile memory 803 thus outputs signals for opening or closing the switches k11 to k1$n$ and k21 to k2$n$. The respective capacitances in the first and second arms are thus defined by means of the configurations stored in the memory 803. The criteria for selecting the proportion between the capacitance in the first arm and the capacitance in the second arm are described in detail here below with reference to FIG. 10.

During the same clock signal edge, which orders the counter 802 to increment or decrement its output value as a function of the value S2, a switch 807 is transiently closed to store the value P2 in the capacitor Cm, and thus have the future value P1. The value of the signal S2 is also stored in a D latch 802 during the same clock edge to generate the following signal Evo.

A same clock signal drives the switch 807, the D latch 805 and the counter 802. The clock signal can be generated from the potential difference at the terminals of the system 11 so that it is in phase with the vibration frequency of the system 5 and so that it is not necessary to provide for an autonomous clock circuit. The leading and trailing edges of the clock signal can be defined by the passage to 0 of the potential difference at the terminals of the system 11. Thus, it is possible to open and close the switches k11 to k1$n$ and k21 to k2$n$ at 0 V thus preventing the untimely transfer of the electrical charges from the capacitors towards the piezoelectric elements.

Figure 7:
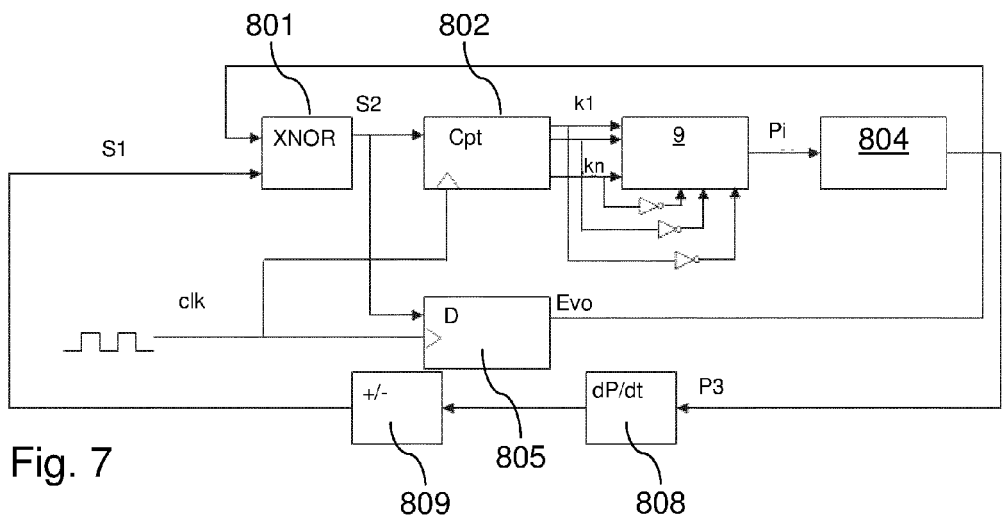
FIG. 7 is a schematic representation of a second variant of an automatic control circuit.

FIG. 7 illustrates a second embodiment of the circuit for tracking the mechanical resonance frequency, having a simplified structure. This circuit is based on a direct automatic control of the electrical power output by the system 11. The instantaneous power Pi at the terminals of the circuit 9 is measured. The power measured is applied to a low-pass filter 804. The low-pass filter 804 outputs the equivalent of a sliding mean value P3 of the measured power. The sliding mean value P3 is applied to a derivative circuit 808. The output signal of the derivative circuit 808 is applied to the input of a circuit 809 (a zero comparator) identifying the sign of the derivative of the signal P3. A signal S1 corresponding to the signal identified is generated at the output of the circuit 809. The signal S1 is equal to 1 if the power is increased and is equal to 0 if not. The signal S1 is applied to an input of an XNOR gate 801. The signal Evo is applied to the other input of the XNOR gate 801. This signal Evo represents the preceding value of S2 representing the preceding evolution of a counter 802, the output of which adjusts the mechanical resonance frequency.

If the signal Evo is identical to the signal S1, the gate 801 generates a signal S2 equal to 1. If not, the signal S2 generated is equal to 0. The signal S2 is applied to the input of the counter 802. The output of the counter 802 directly controls the opening or closing of the switches k11 to k1$n$ and k21 to k2$n$. The control signal applied to a switch k1$i$ is complementary to the control signal applied to a switch k2$i$. Thus, when C1 increases, C2 is reduced, as illustrated here below with reference to the example of FIG. 10. Conversely, when C1 diminishes, C2 increases. Such a control circuit thus proves to be particularly simple. Such control signals are advantageously used with capacitors complying with the relationship defined here above: $C1i=2^{i-1}*C\alpha$, $C2i=2^{i-1}*C\beta$. The values of $C\alpha$ and $C\beta$ make it possible especially to adjust the slope of evolution of C1 and of C2.

During the same clock signal edge which orders the counter 802 to increment or decrement its output value as a function of the value S2, the value of the signal S2 is memorized in a D latch 805 to generate the following signal Evo.

A same clock signal drives the D latch 805 and the counter 802. The clock signal can be generated from the potential difference at the terminals of the system 11 so that it is in phase with the vibration frequency of the system 5 and does not require the generation of an autonomous clock signal.

Figure 8:
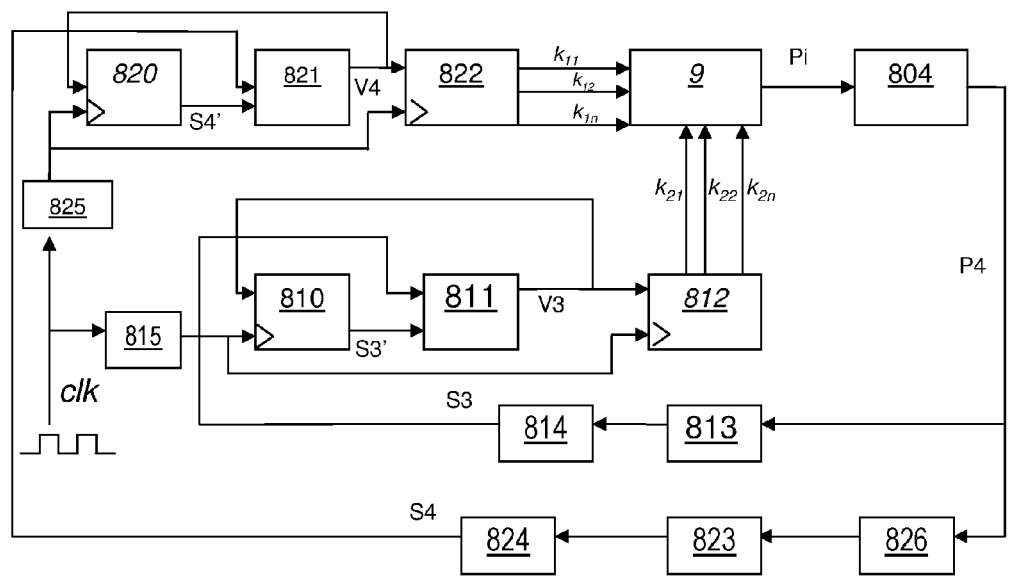
FIG. 8 is a schematic representation of a third variant of an automatic control circuit.

FIG. 8 illustrates a third embodiment of a circuit for tracking the mechanical resonance frequency. This circuit is based on a differentiated automatic control of the resonance frequency and of the electrical damping.

The instantaneous power Pi at the terminals of the circuit 9 is measured. The measured power is applied to a first low-pass filter 804. The low-pass filter 804 outputs the equivalent of a sliding mean P4 of the measured power. The sliding mean P4 is applied firstly to a derivative circuit 813 and secondly to an input of another low-pass circuit 826.

The output signal of the derivative circuit 813 is applied to the input of a circuit 804 identifying the sign of the derivative of the signal P4. A signal S3 corresponding to the identified sign is generated at the output of the circuit 814. The signal S3 is equal to 1 if the power has increased and, if not, it is equal to 0. The signal S3 is applied to an input of an XNOR gate 811. At the other input of the XNOR gate 811 a preceding value S3', stored in a D latch 810, is retrieved.

If the signal S3' is identical to the signal S3, the gate 811 generates a signal V3 equal to 1. If not, the generated signal V3 is equal to 0. The signal V3 is applied to the input of a counter 812. The output of the counter 812, encoded in binary mode on n bits and travelling on n wires, directly commands the opening or closing of the switches k21 to k2$n$ and therefore makes it possible to manage chiefly the electrical damping of the circuit 9.

The output of the low-pass circuit 826 is applied to the input of a derivative circuit 823. The output signal of the derivative circuit 823 is applied to the input of a circuit 824 identifying the sign of the derivative of the signal coming from the circuit 826. A signal S4 corresponding to the identified sign is generated at the output of the circuit 824. The signal S4 is equal to 1 if the power has increased, and, if not, it is equal to 0. The signal S4 is applied to an input of an XNOR gate 821. At the other input of the XNOR gate 821, a previous value S4', stored in a D latch 820 is retrieved.

If the signal S4' is identical to the signal S4, the gate 821 generates a signal V4 equal to 1. If not, the generated signal V4 equals 0. The signal V4 is applied to the input of a counter 822. The output of the counter 822 directly controls the opening or the closing of the switches k11 to k1$n$ and therefore enables chiefly the resonance frequency of the system 11 to be managed.

The clock signal is applied to a frequency divider 815 and to a frequency divider 825. The clock signals coming from the divider 815 are applied to the gate 811 and to the counter 812. The clock signals coming from the divider 825 are applied to the gate 821 and to the counter 822. The frequency division by the divider 815 is greater than the frequency division by the divider 825, for example by a factor 10. It is advantageous to set up an automatic control of the resonance frequency and of the electrical damping with the automatic control loops that have distinct response times in order to prevent the formation of an unstable system. Besides, the response time of the resonance frequency to a modification of capacitance is greater than it is for the damping value. This justifies the use of a greater feedback time in the frequency automatic control loop. This increase in the feedback time is introduced by the second low-pass filter 826 and by a greater division of the clock signal by the divider 815.

During their clock signal edge, the D latches 810 and 820 respectively store the value of the signal V3 and of the signal V4 for their subsequent application to an input respectively of the gate 811 and the gate 821. The counters 812 and 822 respectively increment or decrement their output value on the same clock signal edge depending on the values V3 and V4.

Figure 9:
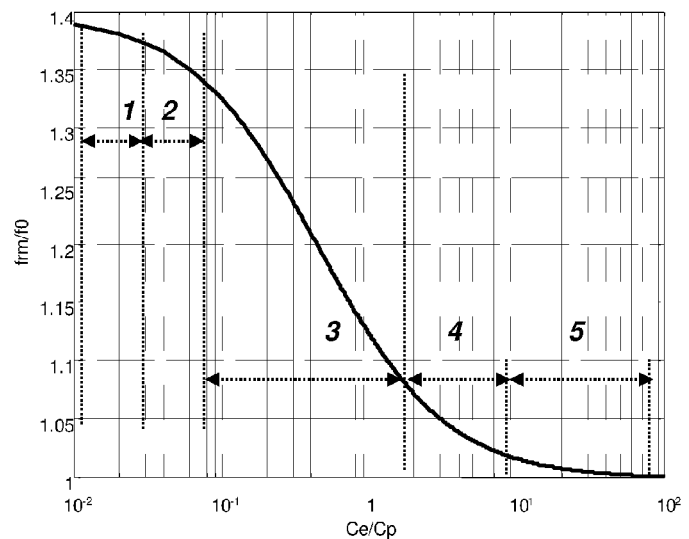
FIG. 9 is a graph illustrating the variation of the mechanical resonance frequency as a function of a value of capacitance.

The graph of FIG. 9 illustrates an example of variation of the mechanical resonance frequency frm as a function of the capacitance values applied inside the circuit 9. More specifically, the x-axis illustrates the ratio between the equivalent capacitance Ce (equivalent capacitance at the arms including the system of capacitors C1 and C2) and the capacitance Cp induced by the piezoelectric elements 110 and 120 of the beam 100. frm is expressed as a proportion of the minimum mechanical resonance frequency f0 of the system 11. The variation of the mechanical resonance frequency represents the variation of the stiffness of the beam 100 via the modification of the stiffness of the piezoelectric elements 110 and 120 by the modification of the electrical load.

The graph as illustrated presents five zones. The zones 1 and 5 correspond to saturation zones which approach, respectively, open-circuit conditions and short-circuit conditions. The presence of the capacitor Cmin in series with the load 4 makes it possible to avoid the saturation zone 1. The zones 2 and 4 correspond to non-linear zones of the circuit. The zone 3 corresponds to a relatively linear zone with a steep slope. The circuit 9 is more easily controlled if the operation is limited to the linear zone 3 of the diagram. Operation of the circuit 9 in the linear zone 3 can be obtained by an appropriate sizing of this capacitor systems C1 and C2, relatively to the capacitance Cp. As illustrated in the diagram, it is possible to remain in the linear zone 3 if the equivalent capacitance Ce varies between 0.1*Cp and 2*Cp.

However, to increase the frequency excursion of the system, it may be judicious to use the zones 2 and 4 too. Advantageously, the operation then takes account of the non-linear aspect when studying the stability of the feedback control loop or loops to size the elements of the loop or loops (clock frequency, no quantification of capacitance, filter cut-off order and frequency, corrector if any, etc). The use of a memory as in the case of FIG. 6, can facilitate the correction of this non-linearity.

Besides, in order to limit the impact of the parasitic capacitances on the working of the conversion device 1, it is advantageous for the capacitance Cp to have a value that is the highest possible. To this end, it is desirable that the piezoelectric elements 110 and 120 should be polarized in their transverse direction if the length of these elements is great relative to their thickness. If the length of these elements is small relative to their thickness, then it is desirable for the piezoelectric elements to be polarized in their longitudinal direction, thus providing for improved electromechanical coupling. To meet the requirements of great beam length as well as benefit from high electromechanical coupling without reducing capacitance, it may prove to be advantageous to attach several piezoelectric elements in the length of the beam, with each of these piezoelectric elements showing polarization along this length.

Figure 10:
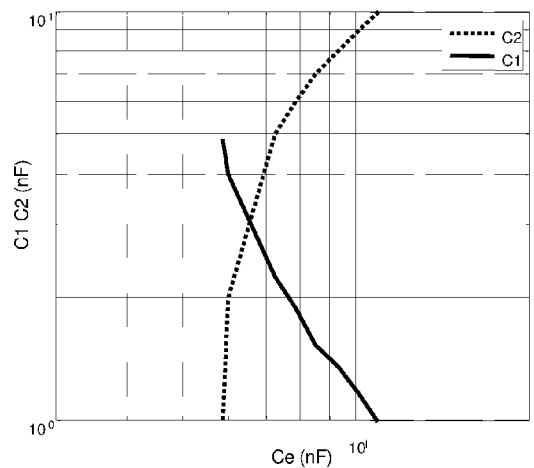
FIG. 10 is a graph illustrating the variation of the capacitance of the electrical circuit as a function of the capacitance values in the two arms.

FIG. 10 is a diagram illustrating the optimal respective capacitance values of the capacitors C1 and C2 according to the equivalent capacitance Ce of the circuit 9. This graph can advantageously serve to define the optimal capacitance values for C1 and C2 in order to determine the switches to be opened or closed in the embodiment of FIG. 6, in which these switches are controlled by the values stored in the non-volatile memory 803.

This graph can be used to regulate the working of the conversion device 1 as follows:

First of all, the equivalent capacitance needed to adjust the mechanical resonance frequency on the vibration frequency is determined. Then, the ratio between the capacitance values of the capacitors C1 and C2 making it possible to define the optimal electrical damping coefficient is determined.

In practice, in the case of FIGS. 6, 7 and 8, it is the output value of the counter that is a reflection of the total capacitance desired, an incrementation or a decrementation of the counter signifying an increase or decrease of the total capacitance. Then, it is the memory (FIG. 6), the parallel steps of incrementation and decrementation (FIG. 7) or again the second automatic control loop (FIG. 8) that enables this overall capacitance to be distributed between C1 and C2.

Figure 11:
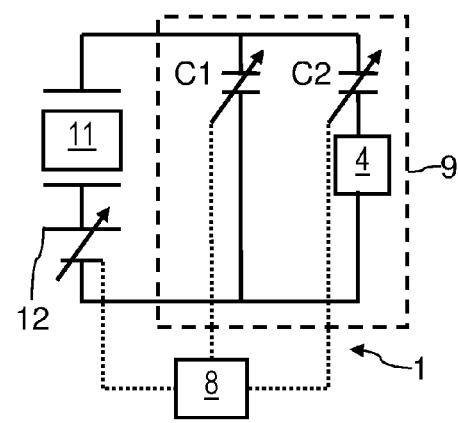
FIG. 11 is a representation of the principle of an improvement of the conversion device according to the invention.

FIG. 11 illustrates an improvement of a conversion device according to the invention. As in the above examples, the mechanical system 11 (comprising the mobile mass 6, the beam 100 and its piezoelectric elements 110 and 120) generates a potential difference between two electrical connection terminals. An adjustment device 12 comprises a DC voltage source with adjustable amplitude, series-connected with the mechanical system 11. An electrical circuit 9 comprising a load to be powered 4 and systems of variable-capacitance capacitors C1 and C2 are connected to the terminals of the assembly formed by the mechanical system 11 and the adjustment device 12. A control device 8 controls the respective capacitance values of the capacitors C1 and C2. The control device 8 controls the electrical field applied to the system 100 by the adjustment device 12.

The principle of this improvement consists in applying an electrical field that is static (but has adjustable amplitude) in the piezoelectric material of the piezoelectric elements 110 and 120 of the mechanical system 11. The application of an alternating mechanical motion to the vibrating support gives rise to a variation of an electrical field in the piezoelectric elements which are superimposed on the static electrical field imposed by the adjustment device 12. This static electrical field increases or reduces the stiffness depending on the sense of its application relative to the polarization of the piezoelectric material. It is thus possible to further widen the range of variation of the mechanical resonance frequency and therefore to use a very wide range of vibration frequencies to harvest energy. The control device 8 thus controls a resonance frequency of the mechanical system 11 according to the voltage applied by the adjustment device 12 (as a complement to its action on the values of the capacitances of the capacitors C1 and C2 which thus influence the resonance frequency of the mechanical system 11). A resistance R of high value (where R is at least ten times greater than $1/(C1*\omega)$ for example) can be placed in parallel with C1 so as to maintain, at its terminals, a mean voltage appreciably equal to zero (eliminating the DC component that could appear at the terminals of C1 and thus modifying the mean electrical field to be applied within the system 11).

According to another improvement, a phase shift between the voltage generated between the piezoelectric elements 110 and 120 and the acceleration of the support 5 is kept constant. The goal of this strategy is to keep the system 11 in operation at its resonance frequency on the basis of a measurement of divergence between the phases causing the respective voltages of the piezoelectric elements 110 and 120 and the acceleration of the vibrating support. The phases of these voltages will be designated respectively by ρ1 and ρ2.

At resonance, the difference in phase between one of the voltage signals and the signal representing acceleration is equal to π/2 (phase quadrature). These two signals tend to be in phase when the excitation frequency is far greater than the resonance frequency of the system 11 and these two signals tend to be in phase opposition when the excitation frequency is lower than the resonance frequency.

The improvement is aimed at achieving a feedback system that maintains the difference in phase in the region of π/2, i.e. keeps the system in resonance.

Figure 12:
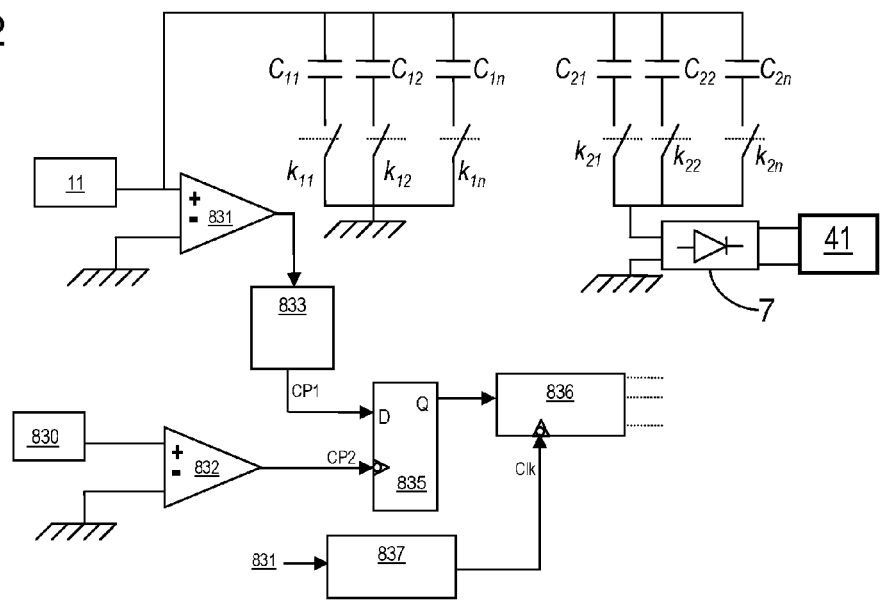
FIGS. 12 to 14 are schematic views of examples of automatic control circuits according to another improvement of the invention.

According to a first embodiment of this improvement illustrated in FIG. 12, two square signals are created respectively from a voltage representing the acceleration of the support 5 and from the voltage at the terminals of the piezo-electric elements of the system 11. An accelerometer 830 applies a signal representing the acceleration of the support 5 at the non-inverter input of a comparator 832. The voltage at the terminals of the system 11 (or the voltage filtered by a high-pass filter in the presence of a device for adjusting the static field 12 or the voltage at the terminals of the capacitor C1) is applied to the non-inverter input of a comparator 831 (an attenuation of the input voltage can also be made, for example through a resistive divider bridge, to prevent having to power the comparator with a voltage as high as the output voltage of the system 11).

The square signal provided at output by the comparator 832 is used as a clock signal for the D latch 835. The square signal given at output of the comparator 831 is applied to the input of a phase lead circuit or phase advance circuit 833. The phase lead circuit 833 applies a π/2 phase lead on the input signal. The output signal is applied to the D input of the latch 835. The D latch 835 serves to compare the position of the vibration frequency relatively to the resonance frequency, with a π/2 shift.

At the time of the leading edge of the output signal of the comparator 831, it is possible to have two distinct cases:

In one case, the excitation frequency of the support 5 is greater than the resonance frequency in which case the signal of the comparator 831 is delayed in phase by more than π/2 relative to the signal of the comparator 832. In this case the resonance frequency is increased until the sign is changed, Alternatively, in the other case, the excitation frequency of the support 5 is below the resonance frequency, in which case the signal of the comparator 831 is delayed in phase by at least π/2 relative to the signal of the comparator 832. In this case, the resonance frequency is decreased until the change in sign.

The output of the D latch 835 is connected directly to the input of a counter 836. This input is used to define the counting sense. The clock input of the counter 836 is controlled by an output of a frequency divider 837 to reduce the counting frequency and consequently the consumption of the system (the division factor is a compromise to be found between the feedback speed of the system and its consumption. In an sizing, the system is given precisely the dynamic range needed to follow the variation in frequency of the input vibration, a speed of variation that depends greatly on the type of variation to be retrieved). The output of the comparator 831 is applied to the input of the frequency divider 837. The counter 836 controls the switches k1n and k2n defining the capacitance values of the capacitors C1 and C2.

Figure 15:
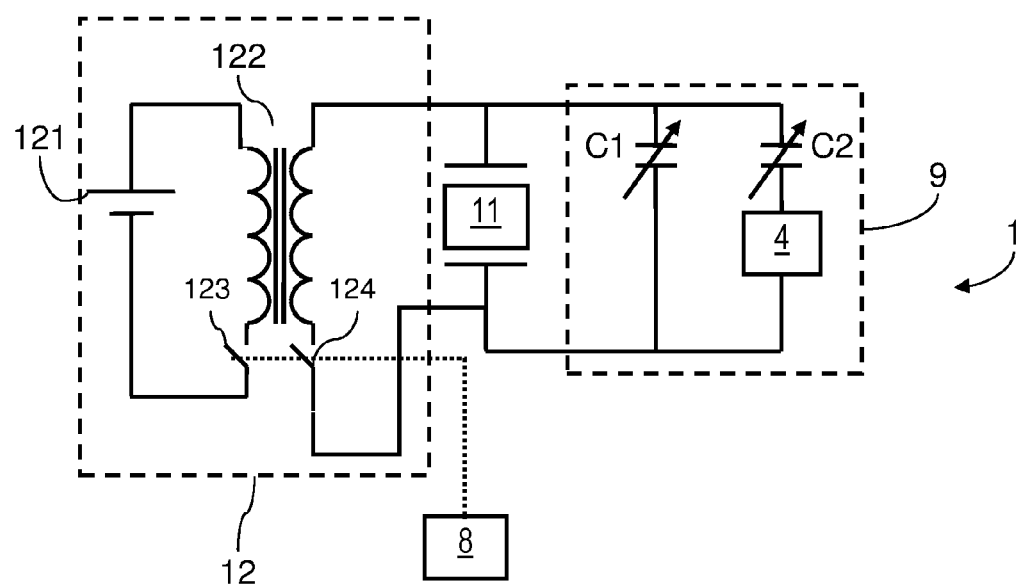
FIG. 15 is a representation of the principle of another improvement of the conversion device according to the invention.

It can be envisaged that the counter 836 can, additionally, in alternation or as a replacement, command an increase or a decrease of a static field in the device 12. This can be either a field value directly proportional to the value of the counter or the most significant bits that manage the value of the field applied and the least significant bits that manage the capacitance values of the capacitors C1 and C2. The static field of the device 12 can this be managed by increments/decrements of electrical energy in the device 12. Instead of incrementing a counter, a small energy pulse is sent to the device 12 and conversely instead of decrementing a counter, a small energy pulse is removed from the device 12. FIG. 15 illustrates such a conversion device. The device 12 includes a power supply 121 connected to the primary winding of a switching converter 122 of the flyback type. The secondary winding of the converter 122 is connected to the terminals of the piezoelectric elements of the system 11. The control circuit 8 controls switches 123 and 124, which are series connected respectively with the primary winding and the secondary winding of the converter 122, in order to remove or send an electric energy pulse in the piezoelectric elements of the system 11.

At each leading edge of the regulation signal, the resonance frequency of Δf is incremented or decremented. In both cases described here above, f<f0 or f>f0 (with f being the vibration frequency of the support 5 and f0 being the resonance frequency of the system), the system gets stabilized around f0, (from f0−Δf to f0+Δf).

Figure 13:
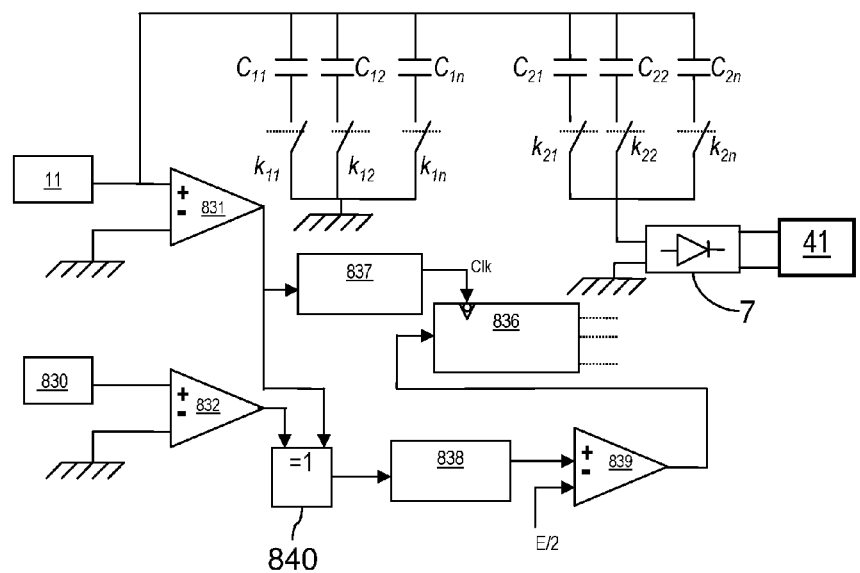

According to a second embodiment of this improvement illustrated in FIG. 13, two square signals are created respectively from a voltage representing the acceleration of the support 5 and from the voltage across the terminals of the piezoelectric elements of the system 11. An accelerometer 830 applies a signal representing the acceleration of the vibrating support 5 at the non-inverter input of a comparator 832. The voltage at the terminals of the system 11 is applied to the non-inverter input of a comparator 831.

The output square signals from the comparators 831 and 832 are applied to the input of an XNOR gate 840. The output of the gate 840 is connected to the input of a low-pass filter 838. The output signal from this filter 838 represents the mean of the output voltage from the XNOR gate 840. This mean U is typically computed on a cycle of ten periods of mechanical vibration. This voltage mean U is proportional to the phase shift between the square-wave signals at the output of the comparators 831 and 832. The output of the signal 838 is applied to the non-inverter input of a comparator 839. A voltage E/2 is applied to the inverter input of the comparator 839. The voltage E corresponds to the power supply voltage of the XNOR gate 840 and therefore to the maximum value attainable by the voltage U.

If $f<f0$: $U>E/2 (\Delta\omega>\pi/2)$

If $f=f0$: $U=E/2 (\Delta\omega=\pi/2)$

If $f>f0$: $U<E/2 (\Delta\omega<\pi/2)$

The output of the comparator 839 is directly connected to the input of a counter 836. This input serves to define the sense of the counting. The clock signal input of the counter 836 is controlled by an output of a frequency divider 837. The output of the comparator 831 is applied to the input of the frequency divider 837. The counter 826 commands the switches k1n and k2n defining the values of the capacitances of the capacitors C1 and C2.

The aim is to position the resonance frequency that is the closest possible to the vibration frequency of the vibrating support 5. The voltage U is therefore compared with the voltage E/2. If U>E/2, then the resonance frequency is diminished. If U<E/2, then the resonance frequency is increased.

Figure 14:
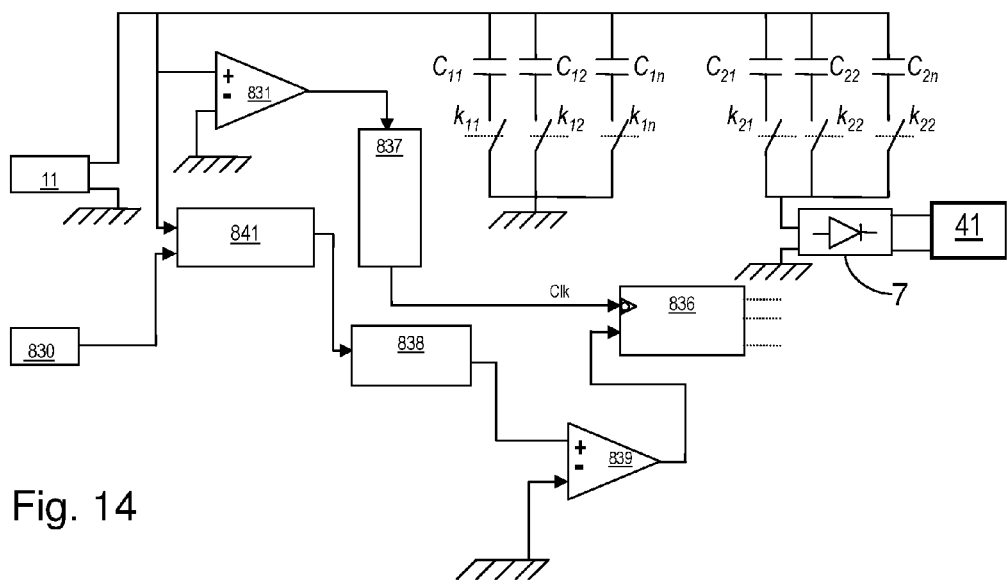

According to a third embodiment of this improvement illustrated in FIG. 14, a voltage representing the acceleration of the vibrating support 5 and the voltage at the terminals of the piezo-electric elements of the system 11 is applied to the respectively inputs of a multiplier circuit 841. The multiplier circuit 841 carries out an analog multiplication of these two voltages. The output signal of the multiplier 841 thus comprises a DC component and an AC component. The AC component has a frequency equal to twice the vibration frequency. The DC component represents the phase shift between these two voltages. It is possible to take a mean of the output signal of the multiplier 841, for example on about 10 mechanical vibration periods and thus extract the DC component that is the image of the phase shift. The output of the multiplier 841 is applied to a filter 838. The filter 838 eliminates the AC component and applies the DC component at its output. The output of the filter 838 is applied to the non-inverter input of a comparator 839.

According to the following equation, the system goes into resonance when the DC component is zero because the voltages are then in phase quadrature.

$$V_{841}(t) = V_{830} * V_{11}(t) = 0.5 V_{acc830} \cdot V_{11} * \cos(\Delta\omega) + \cos(2\omega + \omega_1 + \omega_2)$$

Using the comparator 839, it is sought to stabilize the system to the point where the DC component at output of the multiplier 841 remains as close as possible to zero. The output of the comparator 839 is directly connected to the input for controlling the counting sense of a counter 836.

The voltage at the terminals of the system 11 is applied to the non-inverter input of a comparator 831. The clock signal input of the counter 836 is controlled by an output of a frequency divider 837. The output of the comparator 831 is applied to the input of the frequency divider 837. The counter 836 controls the switches k1$n$ and k2$n$ defining the capacitance values of the capacitors C1 and C2.

Depending on the position of the resonance frequency relative to the vibration frequency, the comparator 839 modifies the counting sense.

In the examples presented here above, the system for converting mechanical energy into electrical energy is based on a beam provided with piezo-electric elements. The invention also applies to any other system for converting vibration energy into electrical energy, for example an electrostatic system.

The electrostatic system can comprise two electrodes facing each other that are mobile relative to each other under the effect of vibration. The electrostatic system can be based either on a recharging of the electrodes by a power supply or on the presence of an electret that is mobile relative to at least one of the electrodes.

The invention claimed is:

1. An apparatus for converting mechanical vibration energy into electrical energy, said apparatus comprising a converter that, when subjected to vibrations, generates an electrical potential difference, an electrical circuit connected to terminals of said converter, said electrical circuit comprising a first arm and a second arm parallel to said first arm, said first arm comprising a first variable-capacitance capacitor system, said second arm comprising an electrical load to be powered, and a second variable-capacitance capacitor series-connected with said electrical load, and a control circuit configured to modify respective capacitance values of said first and second capacitor systems so as to modify a mechanical resonance frequency of said converter.

2. The apparatus of claim 1, wherein said converter comprises a piezoelectric system configured to be deformed during application of said vibrations thereto.

3. The apparatus of claim 2, wherein said piezoelectric system is attached to a beam having a first end embedded in a vibrating support and a second end embedded in a mobile mass.

4. The apparatus of claim 3, wherein the piezoelectric system is polarized in a direction of a length of said beam.

5. The apparatus of claim 3, wherein said terminals are connected to said piezoelectric system, said apparatus further comprising an accelerometer configured to measure instantaneous acceleration of said vibrating support, and a device for measuring an instantaneous voltage at said terminals, wherein said control circuit is configured to modify said respective capacitance values so as to maintain a voltage at said terminals in phase-quadrature with acceleration of said vibrating support.

6. The apparatus of claim 5, further comprising a first comparator circuit that generates a first square signal from a measurement of said instantaneous acceleration, a second comparator circuit that generates a second square signal from a measurement of said voltage, and a phase-shift circuit that applies a 90° phase shift to a selected signal, said selected signal being selected from one of said first and second generated square signals, wherein said control circuit modifies said respective capacitance values of said first and second capacitor systems as a function of a relative phase between said phase-shifted signal generated from said selected square signal and an other of said first and second generated square signals.

7. The apparatus of claim 5, said apparatus further comprising a first comparator circuit that generates a first square signal from a measurement of said instantaneous acceleration, a second comparator circuit that generates a second square signal from a measured value of said voltage, and a circuit that determines a duty cycle of an overlap between said first square signal and said second square signal, wherein said control circuit is configured to modify said respective capacitance values of said first and second capacitor systems as a function of said duty cycle of said overlap.

8. The apparatus of claim 5, further comprising an analog multiplier that multiplies a measurement of said acceleration by a measurement of said voltage, and wherein said control circuit is configured for modifying the respective capacitance values of the first and second capacitor systems as a function of the DC component of the output signal of said analog multiplier.

9. The apparatus of claim 2, wherein said first and second capacitor systems are sized so that said control circuit is able to cause an equivalent capacitance of said first and second arms in parallel to vary between a value below 0.2*Cp and a value above 1.5*Cp, wherein Cp is a capacitance of said piezoelectric system.

10. The apparatus of claim 2, further comprising a DC voltage source series-connected with said converter, said DC voltage source having an adjustable amplitude, and wherein said control circuit is configured to modify said amplitude of said DC voltage source.

11. The apparatus of claim 1, wherein said first and second capacitor systems comprise a set of capacitors, each of the capacitors of said set being series-connected with a respective switch controlled by said control circuit.

12. The apparatus of claim 11, wherein said first arm comprises a set of n capacitors C1$i$ connected in parallel, i being an integer ranging from 1 to n, each capacitor C1$i$ being series-connected with a respective switch k1$i$, capacitance values of the capacitors C1$i$ being defined by the relationship: C1$i$=$2^{(i-1)}$*C$\alpha$, wherein C$\alpha$ is a reference capacitance value, and wherein said second arm comprises a set of n capacitors C2$i$ connected in parallel, i being an integer between 1 and n, each capacitor C2$i$ being series-connected with a respective switch k2$i$, capacitance values of said capacitors C2$i$ being defined by the relationship: C2$i$=$2^{(i-1)}$*C$\beta$, wherein C$\beta$ is a reference capacitance value.

13. The apparatus of claim 11, further comprising a digital counter, each output bit of which controls a respective switch.

14. The apparatus of claim 1, wherein said control circuit comprises a regulation circuit configured to modify capacitance values of said first and second systems of capacitors so as to optimize power in said load of said electrical circuit.

15. The apparatus of claim 1, wherein a maximum difference in potential generated by said converter is at least five times greater than a difference in potential for powering said electrical load to be powered.

16. The apparatus of claim 1, wherein said converter includes at least an electret and two collector electrodes, said electret being movable relative to one of said collector electrodes under the effect of vibration.

* * * * *